US008664041B2

United States Patent
Tseng et al.

(10) Patent No.: US 8,664,041 B2
(45) Date of Patent: Mar. 4, 2014

(54) METHOD FOR DESIGNING A PACKAGE AND SUBSTRATE LAYOUT

(75) Inventors: Yu-Jen Tseng, Hsin-Chu (TW);
Guan-Yu Chen, Hsin-Chu (TW);
Sheng-Yu Wu, Hsin-Chu (TW);
Chen-Hua Yu, Hsin-Chu (TW);
Mirng-Ji Lii, Sinpu Township (TW);
Chen-Shien Chen, Zhubei (TW);
Tin-Hao Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 15 days.

(21) Appl. No.: 13/445,699

(22) Filed: Apr. 12, 2012

(65) Prior Publication Data

US 2013/0270693 A1    Oct. 17, 2013

(51) Int. Cl.
*H01L 21/44* (2006.01)
*H01L 21/48* (2006.01)
*H01L 21/50* (2006.01)

(52) U.S. Cl.
USPC .......... 438/107; 438/110; 438/613; 257/737; 257/786

(58) Field of Classification Search
USPC .......... 438/107, 108, 110, 613; 257/737, 786
See application file for complete search history.

(56) References Cited

U.S. PATENT DOCUMENTS

| | | | |
|---|---|---|---|
| 6,310,403 B1 * | 10/2001 | Zhang et al. | 257/786 |
| 7,982,137 B2 * | 7/2011 | Cooney et al. | 174/257 |
| 2011/0169159 A1 * | 7/2011 | Lin et al. | 257/692 |

* cited by examiner

*Primary Examiner* — Phuc Dang
(74) *Attorney, Agent, or Firm* — Slater & Matsil, L.L.P.

(57) ABSTRACT

A method and device for preventing the bridging of adjacent metal traces in a bump-on-trace structure. An embodiment comprises determining the coefficient of thermal expansion (CTE) and process parameters of the package components. The design parameters are then analyzed and the design parameters may be modified based on the CTE and process parameters of the package components.

20 Claims, 8 Drawing Sheets

METHOD FOR DESIGNING A PACKAGE AND SUBSTRATE LAYOUT

BACKGROUND

Integrated circuits are made up of literally millions of active devices such as transistors and capacitors. These devices are initially isolated from each other, and are later interconnected to form functional circuits. Typical interconnect structures include lateral interconnections, such as metal lines (wirings), and vertical interconnections, such as vias and contacts. Interconnect structures are increasingly determining the limits of performance and the density of modern integrated circuits.

On top of the interconnect structures, connector structures are formed, which may include bond pads or metal bumps formed and exposed on the surface of the respective chip. Electrical connections are made through the bond pads/metal bumps to connect the chip to a package substrate or another die. The electrical connections may be made using bump-on-trace (BOT) structures, wherein the connections are made through the metal bumps to connect the chip to the metal traces of the package substrate or die. This type of electrical connection may be used in flip-chip packages.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

A package comprising a bump-on-trace (BOT) structure is provided in accordance with an embodiment. The variations of the embodiment are discussed. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
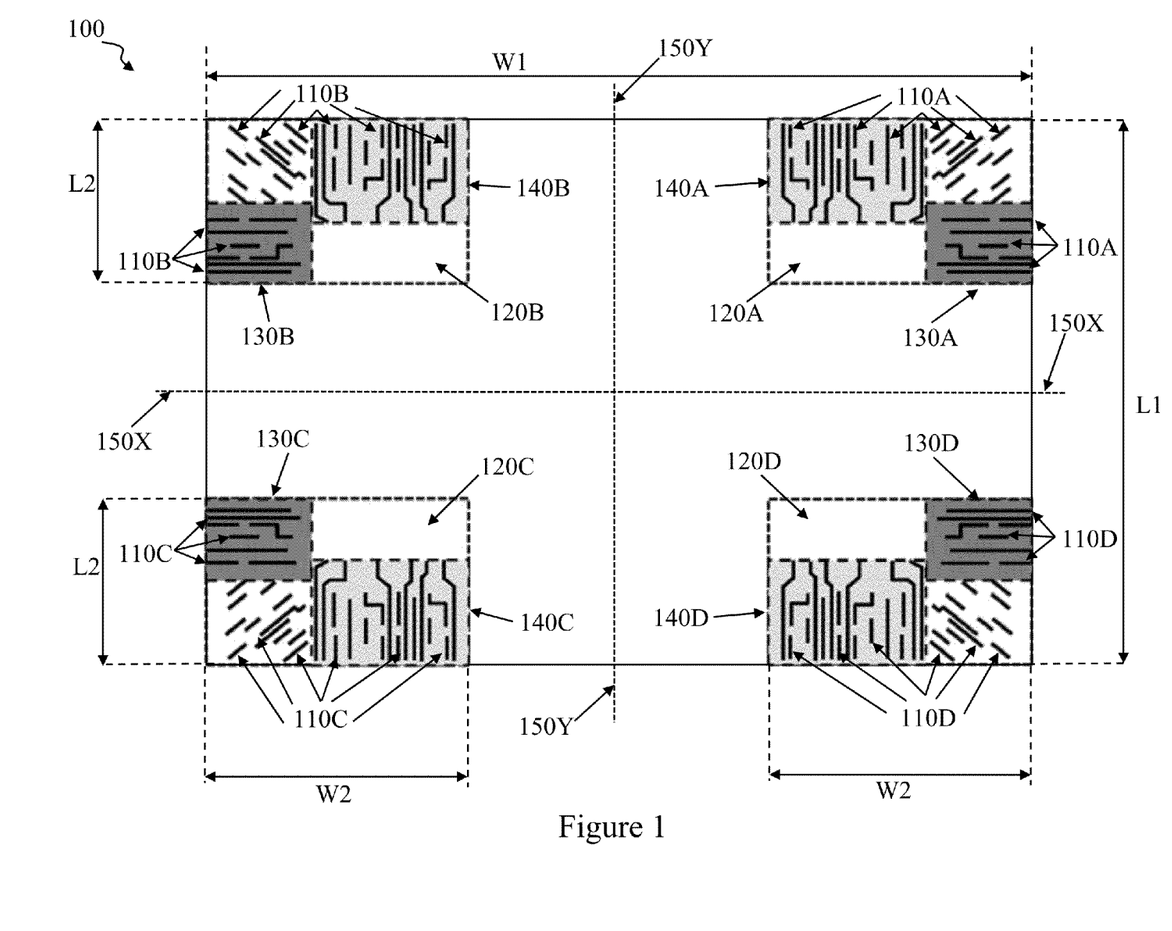
FIG. 1 illustrates in a top view of a first package component in accordance with an embodiment.

FIG. 1 illustrates a top view of a package component 100 with a length L1 and a width W1 in accordance with various embodiments. Package component 100 may be a package substrate, although it may be another type of package component such as a device die, a printed circuit board (PCB), an interposer, or the like. Package component 100 may include a plurality of metal traces 110 (including metal traces 110A through 110D in each of the corners) on a surface of the package component 100. In addition, FIG. 1 illustrates the corners 120 (including compensation region 120A through 120D) of the package component 100, vertical compensation regions 130 (including vertical compensation region 130A through 130D in the respective corners), and horizontal compensation regions 140 (including 140A through 140D in the respective corners). In FIG. 1, the metal traces 110 are only shown near the corners of the package component 100 for clarity. However, as one of ordinary will appreciate, there may be metal traces 110 throughout the package component 100.

The corners 120 each have a length L2 and a width W2. The length L2 is from approximately 10% to 20% of the total length L1 of the package component 100. The width W2 is from approximately 10% to 20% of the total width W2 of the package component 100. For example, in an embodiment, the width W1 is 12 mm and the length L1 is 10 mm. Thus, the corners 120 have a width W1 from approximately 1.2 mm to 2.4 mm and the length L2 from approximately 1.0 mm to 2.0 mm.

The vertical compensation regions 130 and horizontal compensation regions 140 are within each of their respective corners 120. The boundaries of the vertical compensation regions 130 and horizontal compensation regions 140 are defined by the areas inside the corners 120 where the metal traces 110 are perpendicular to the edge of the package component 100. As discussed later, the metal traces 110 will be compensated in the vertical direction (in the same direction as line 150Y in FIG. 1) in the vertical compensation regions 130 and in the horizontal direction (in the same direction as 150X in FIG. 1) in the horizontal compensation regions 140. Each corner 120 contains a plurality of metal traces 110 that are diagonal to the edges of the package component 100, and are therefore excluded from the compensation regions. In addition, vertical compensation regions 130 and horizontal compensation regions 140 may be excluded where the total length L1 of the package component 100 is less than 6 mm or the total width W1 of the package component 100 is less than 6 mm.

Metal traces 110 may be formed of substantially pure copper, aluminum copper, or other metallic materials such as tungsten, nickel, palladium, gold, and/or alloys thereof. The metal traces 110 may be formed over a dielectric layer or in a dielectric layer. In some embodiments, the dielectric layer may cover some portions of the metal traces 110. The package component 100 may be bonded to a package component 200 through metal pillars 260 and solder bumps 270 (see FIG. 2), which are bonded to, and contact, the metal traces 110.

Figure 2:
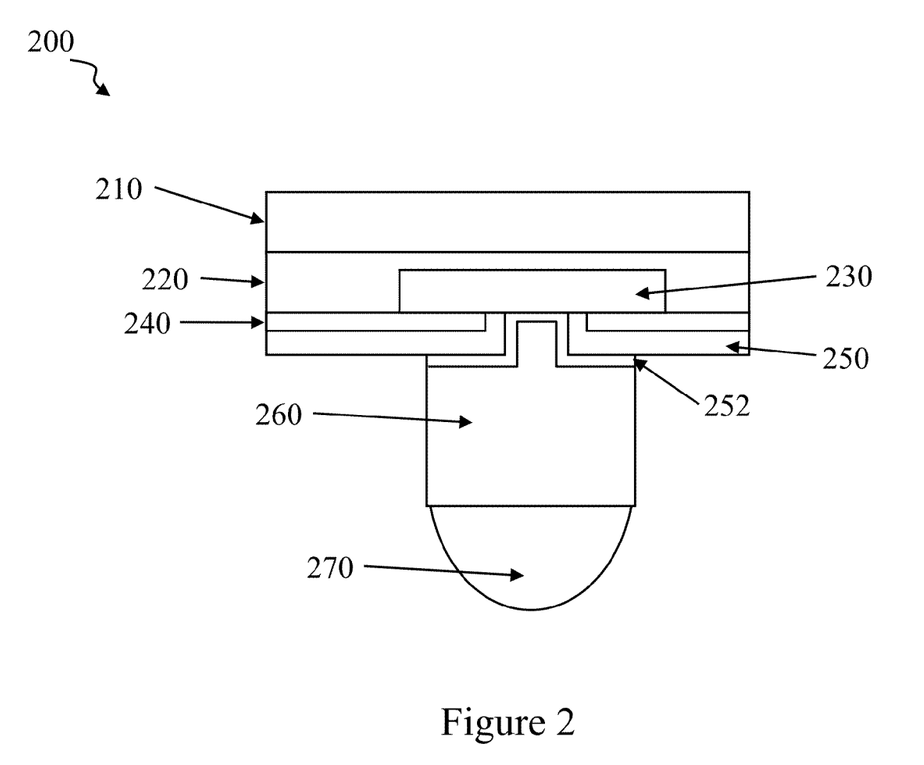
FIG. 2 illustrates in a cross-sectional view a portion of a second package component in accordance with an embodiment.

FIG. 2 illustrates a cross-sectional view of a portion of the package component 200 including a semiconductor substrate 210, a first passivation layer 220, a metal pad 230, a second passivation layer 240, a third passivation layer 250, an under-bump metallization (UBM) 252, a metal pillar 260, and a solder bump 270.

The semiconductor substrate 210 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 210 may include active devices (not shown in FIG. 2 for clarity). As one of ordinary skill in the art will recognize, a wide variety of active devices such as transistors, capacitors, resistors, combinations of these, and the like may be used to generate the desired structural and functional requirements of the design for the package component 200. The active devices may be formed using any suitable methods.

The semiconductor substrate 210 may also include metallization layers (also not shown in FIG. 2 for clarity). The metallization layers may be formed over the active devices and are designed to connect the various active devices to form functional circuitry. The metallization layers (not shown) may be formed of alternating layers of dielectric (e.g., low-k dielectric material) and conductive material (e.g., copper) and may be formed through any suitable process (such as deposition, damascene, dual damascene, etc.).

The first passivation layer 220 may be formed on the semiconductor substrate 210. The first passivation layer 220 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The first passivation layer 220 may be formed through a process such as chemical vapor deposition (CVD), although any suitable process may be utilized. The first passivation layer 220 may include metal lines and vias (not shown) to electrically couple active and passive devices to the metal pad 230.

The metal pad 230 may be formed in or over the first passivation layer 220, and may be electrically coupled to active and passive devices through the metal lines and vias in the first passivation layer 220. The metal pad 230 may comprise aluminum, but other materials, such as copper, may alternatively be used. The metal pad 230 may be formed using a deposition process, such as sputtering, to form a layer of material (not shown) and portions of the layer of material may then be removed through a suitable process (such as photolithographic masking and etching) to form the metal pad 230. However, any other suitable process may be utilized to form the metal pad 230. The metal pad 230 may be formed to have a thickness of between about 1.45 μm and about 2.8 μm, such as about 2 μm.

The second passivation layer 240 may be formed to cover the edge portion of the metal pad 230, while leaving a central portion of the metal pad exposed through an opening in the second passivation layer 240. The second passivation layer 240 may be made of one or more suitable dielectric materials such as silicon oxide, silicon nitride, a polymer such as polyimide, combinations of these, or the like. The second passivation layer 240 may be formed through a process such as chemical vapor deposition (CVD), although any suitable process may be utilized.

The third passivation layer 250 may be formed over the second passivation layer 240. The third passivation layer 250 may be formed from a polymer such as polyimide, or may alternatively be formed of a similar material as the first passivation layer 220 and the second passivation layer 240 (e.g., silicon oxides, silicon nitrides, combinations of these, and the like), or any other suitable organic or inorganic passivation material. The third passivation layer 250 may be patterned to form an opening, through which the metal pad 230 is exposed. The patterning of the third passivation layer 250 may be performed using a suitable process such as photolithographic masking and etching.

The UBM 252 may be formed over the third passivation layer 250 and the metal pad 230. In an embodiment, the UBM 252 may include one or more seed layers, which may be formed of copper, titanium, copper alloys, or the like. The seed layers may be deposited by PVD or CVD, although other acceptable methods and materials may alternatively be used. The UBM 252 may comprise chrome, a chrome-copper alloy, copper, gold, titanium, titanium tungsten, nickel, combinations thereof, or the like. The UBM 252 may be formed by a plating process, such as electrochemical plating, although other processes of formation, such as sputtering, evaporation, or PECVD process, may alternatively be used depending upon the desired materials.

The metal pillar 260 may be formed over the UBM 252 with the edges of the metal pillar 260 aligned to the respective edges of the UBM 252. UBM 252 may be in physical and electrical contact with the metal pad 230 and the metal pillar 260. The metal pillar 260 may comprise copper, copper alloys, or the like and may be formed by a plating process, such as electrochemical plating, although other processes of formation, such as sputtering or evaporation, may alternatively be used depending upon the desired materials. In an embodiment, the metal pillar 260 is formed of a non-reflowable metal that does not melt in reflow processes.

The solder bump 270 may be formed on the top surface of the metal pillar 260. The solder bump 270 may comprise a material such as tin, or other suitable materials, such as silver, lead-free tin, copper, combinations thereof, or the like. In an embodiment in which the solder bump 270 is a tin solder bump, the solder bump 270 may be formed by initially forming a layer of tin through such commonly used methods such as evaporation, electroplating, printing, solder transfer, ball placement, etc, to a thickness of, e.g., about 15 μm, and then performing a reflow in order to shape the material into the desired bump shape. Any suitable method of producing the solder bump 270 may alternatively be utilized.

Figure 6:
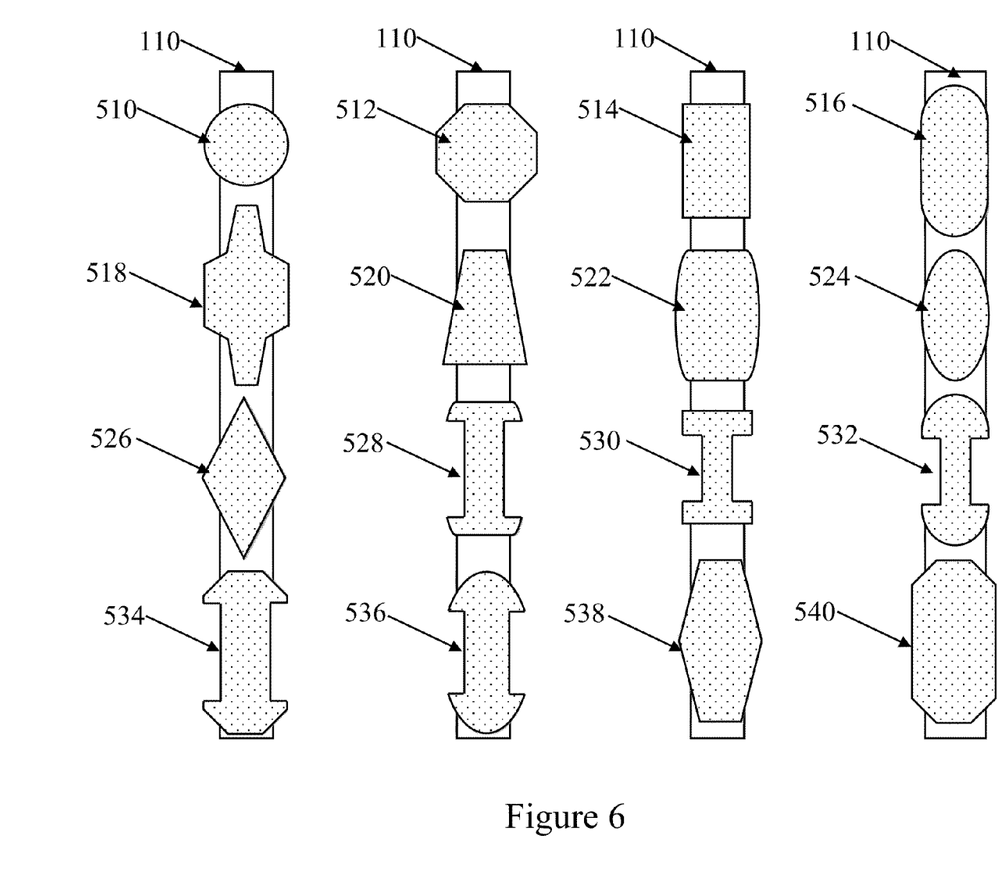
FIG. 6 illustrates in a top view a plurality of metal pillar and solder bump shapes in accordance with an embodiment.

The metal pillar 260 and solder bump 270 may be formed in a plurality of shapes as appropriate to avoid nearby components, control the connection area between the metal pillar 260 and the metal trace 110, or other suitable reasons. FIG. 6 illustrates a top view for several different shapes of the metal pillar 260 and solder bump 270. Metal pillar 260 and solder bump 270 may be alternatively referred to as an electrical connector hereinafter. The electrical connector 510 is in the shape of a circle. The shape of electrical connector 512 is an octagon. The shape of electrical connector 514 is a rectangle. The shape of electrical connector 516 is an elongated circle. The shape of electrical connector 518 comprises an elongated hexagon with two trapezoids on opposite ends of the elongated hexagon. The shape of electrical connector 520 is a trapezoid. The shape of electrical connector 522 is similar to the shape of electrical connector 514 but with rounded sides.

The shape of electrical connector 524 is an oval. The shape of electrical connector 526 is a diamond. The shape of electrical connector 530 comprises a vertical piece with two horizontal pieces on opposite ends of the vertical piece. The shape of electrical connector 528 is similar to the shape of the electrical connector 530 but with the horizontal pieces having rounded edges. The shape of electrical connector 528 is similar to the shape of the electrical connector 530 but with the horizontal pieces each comprising a semicircle. The shape of electrical connector 528 is similar to the shape of the electrical connector 530 but with the horizontal pieces each comprising a half octagon. The shape of electrical connector 528 is similar to the shape of the electrical connector 530 but with the horizontal pieces each comprising a half of an oval. The shape of electrical connector 538 is an elongated hexagon. The shape of electrical connector 540 is in an elongated octagon. As one of ordinary skill in the art will appreciate, the shapes of the metal pillar 260 and the solder bump 270 described above and illustrated in FIG. 6 are not exhaustive and the metal pillar 260 and the solder bump 270 may be formed in any suitable shape.

Figure 3A:
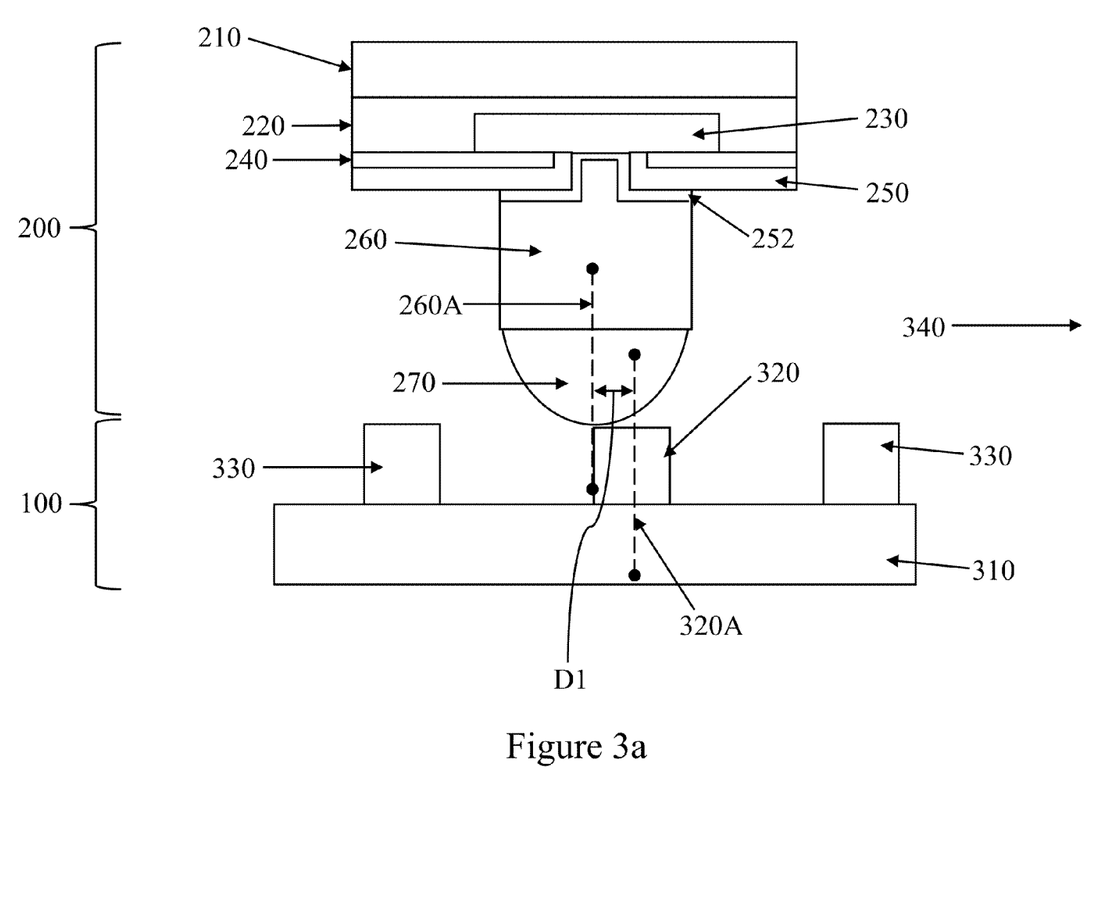
FIGS. 3a through 3c illustrate in cross-sectional views and a top view, respectively, the steps of manufacture of the first and second package components into a device structure in accordance with an embodiment.
Figure 3B:
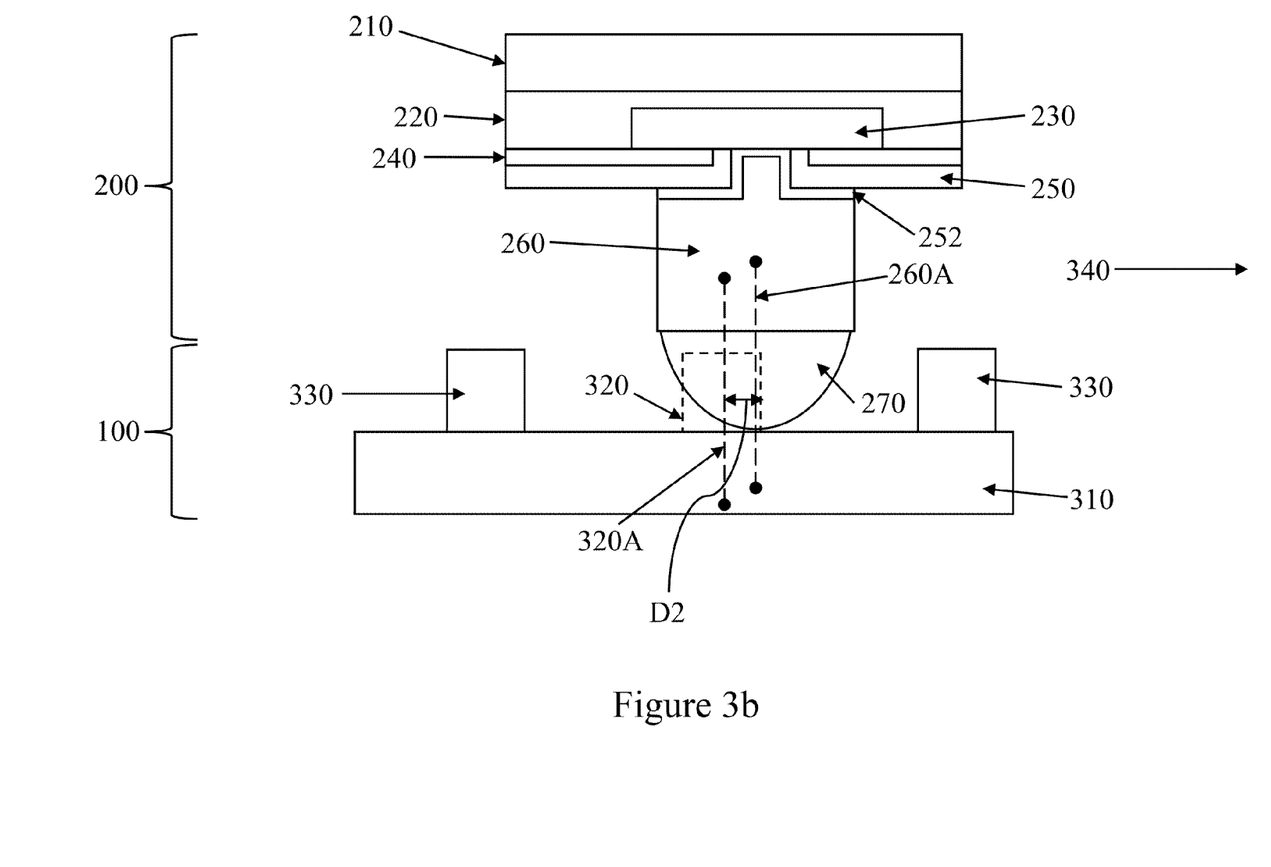
Figure 3C:
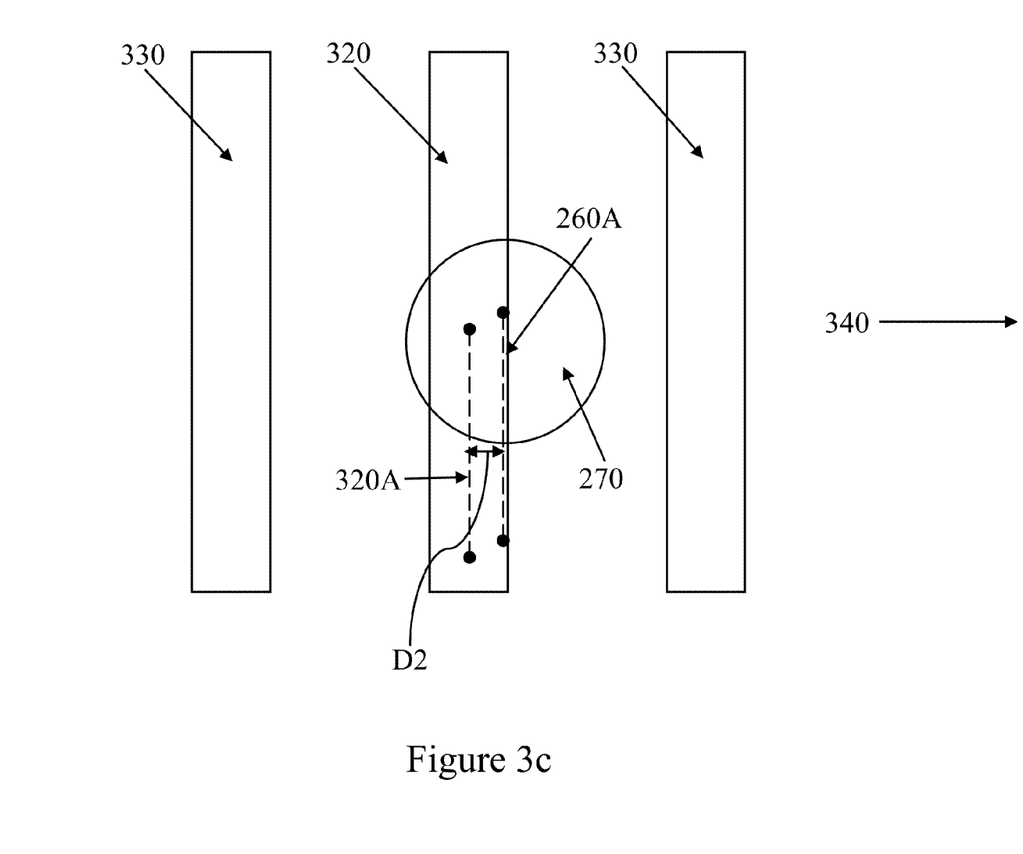

FIG. 3a illustrates a cross-sectional view of the package components 100 and 200 before they are bonded together. FIGS. 3b and 3c illustrate a cross-sectional view and top view, respectively, of the package components 100 and 200 after they are bonded together. The bonding process may be a reflow process or other acceptable methods to bond the package components 100 and 200. Package component 100 includes a landing trace 320, adjacent metal traces 330, and a package substrate 310.

The landing trace 320 and the adjacent metal traces 330 are equivalent to the metal traces 110 in FIG. 1. The landing trace 320 is the metal trace that is being bonded to the metal pillar 260 and solder bump 270 in FIGS. 3a through 3c. The adjacent metal traces 330 are the metal traces that are nearest to the landing trace 320 with no metal traces between the landing trace 320 and the adjacent metal traces 330.

The package substrate 310 may provide the package with mechanical support and an interface that allows external components access to the device within the package. The package substrate 310 may be a laminate substrate formed as a stack of multiple thin layers (or laminates) of a polymer material such as bismaleimide triazine (BT), FR-4, or the like. The package substrate 310 may comprise several layers of metal planes and metal traces that are interconnected to each other by through-hole plated vias. The metal traces may be formed by etching copper foil that is bonded to one or more of the laminates of the package substrate 310. The metal traces may be finished with a layer of electroless nickel followed by a layer of immersion gold. The layer of nickel may prevent the interdiffusion of the copper and solder while the gold helps to prevent oxidation and improves solderability. In some embodiments, laminate substrates have an even number of routing layers. For example, in a four-layer laminate substrate, the top and bottom layers may be the routing layers while the inner layers may be used as a ground plane and a power plane.

As shown in FIG. 3a, the metal pillar 260 and solder bump 270 are misaligned with the landing trace 320. The metal pillar 260 has a center 260A which is shown as a line 260A in FIG. 3a. The landing trace 320 also has a center 320A which is shown as line 320A in FIG. 3a. In accordance with embodiments, center 260A is misaligned with center 320A by a distance D1. In FIG. 3a, the arrow 340 is drawn to illustrate the direction of the center of the package component 100 as shown by dashed lines 150X or 150Y (see FIG. 1). In an embodiment, the package component 100 may have a first coefficient of thermal expansion (CTE) different from a second CTE of package component 200. Accordingly, the center 260A of the metal pillar 260 may need to be misaligned with the center 320A of the landing trace 320 before the bonding process, so that when heated in the bonding process, because of the difference between the first and the second CTEs, the metal pillar 260 does not bridge the landing trace 320 and an adjacent metal trace 330 (FIG. 3a). As an example, in an embodiment, the package component 100 has a composite CTE of approximately 10 ppm/° C., the package component 200 has a composite CTE of approximately 3 ppm/° C., and the two components are heated to approximately 245° C. during the bonding process. In this example, before the bonding process, the center 320A of the landing trace 320 may be approximately between 8 μm and 10 μm closer to the center 150X or 150Y of the package component 100 (see FIG. 1) than the center 260A of the metal pillar 260 to help prevent the bridging of the landing trace 320 and an adjacent metal trace 330. Thus, in this example, the distance D1 between the center 260A and the center 320A is approximately between 8 μm and 10 μm. After cooling down from the bonding process, the center 260A and the center 320A may not be perfectly in alignment but as illustrated in FIGS. 3b and 3c the distance between the center 260A and the center 320A is shown by the distance D2. In the above example, the distance D2 may be between approximately 0 μm and 4 μm. Accordingly, in the design of the landing trace 320, the metal pillar 260, and the respective package component 100 and package component 200, the expansion of the materials needs to be taken into account.

A design calculator 400 (discussed further below with respect to FIG. 4) may be used to determine the layout of the package component 100. The design calculator 400 may determine the CTE values and processing parameters for both package components 100 and 200. The design calculator 400 may use this data to analyze and modify the layout of the package component 100 by shifting the landing traces 320 to compensate for the CTE differences between the package components 100 and 200. The amount of shifting of the landing traces, the value of distance D1, in μm, may be calculated by the following formula:

$$D1 = ((CTE_1 * \Delta Temp_1) - (CTE_2 * \Delta Temp_2)) * \text{Distance from Center} * \text{Scaling factor}$$

The variables $CTE_1$ and $CTE_2$ are the composite CTE values in ppm/° C. for the two package components, wherein $CTE_1$ is the composite CTE value of the package substrate 310 and $CTE_2$ is the composite CTE value of the semiconductor substrate 210. The variable $\Delta Temp_1$ is the temperature difference of the package substrate 310 between the solder bump 270 solidification temperature and room temperature in ° C. The variable $\Delta Temp_2$ is the temperature difference of the semiconductor substrate 210 between the solder bump 270 solidification temperature and room temperature in ° C. The variable "Distance from Center" is the distance the center 260A of the metal pillar 260 is from the center of the package component 100 in μm as illustrated by the appropriate dashed line 150X or 150Y in FIG. 1. The appropriate dashed line 150X or 150Y is the dashed line that is substantially parallel to the metal trace 110 (see landing trace 320 in FIG. 3a through 3c) that the metal pillar 260 is being bonded to. For example, the metal traces 110A in horizontal compensation region 140A are substantially parallel to the dashed line 150Y, and, therefore, the distance is measured between 150Y and the center 260A of the metal pillar 260 being bonded to the metal trace 110A in the horizontal compensation region 140A. The variable "Scaling factor" is a value that may account for variations in processing and may also be used to modify the distance D2 (see FIGS. 3b and 3c).

In another embodiment, the composite CTE of the package component 100 may be smaller than the composite CTE of the package component 200, and, therefore the center 320A of the landing trace 320 may be shifted further away from the center of the package component 100 than the center 260A of the metal pillar 260 to compensate for the CTE difference.

The difference in the CTE between the package components 100 and 200 may become less significant as you get closer to the center dashed lines 150X and 150Y of FIG. 1. Thus, the formula above for calculating D1 is only applied to the vertical compensation regions 130 and the horizontal compensation regions 140 of package component 100. In an embodiment, the connections made between a metal pillar 260 and a landing trace 320 outside of the vertical compensation regions 130 and the horizontal compensation regions 140 may not have to be compensated to prevent bridging between the landing trace 320 and the adjacent metal trace 330. For example, the D1 between the center 260A of a metal pillar 260 and the center 320A of a landing trace 320 outside of the vertical compensation regions 130 and the horizontal compensation regions 140 may be approximately 0 μm.

Figure 4:
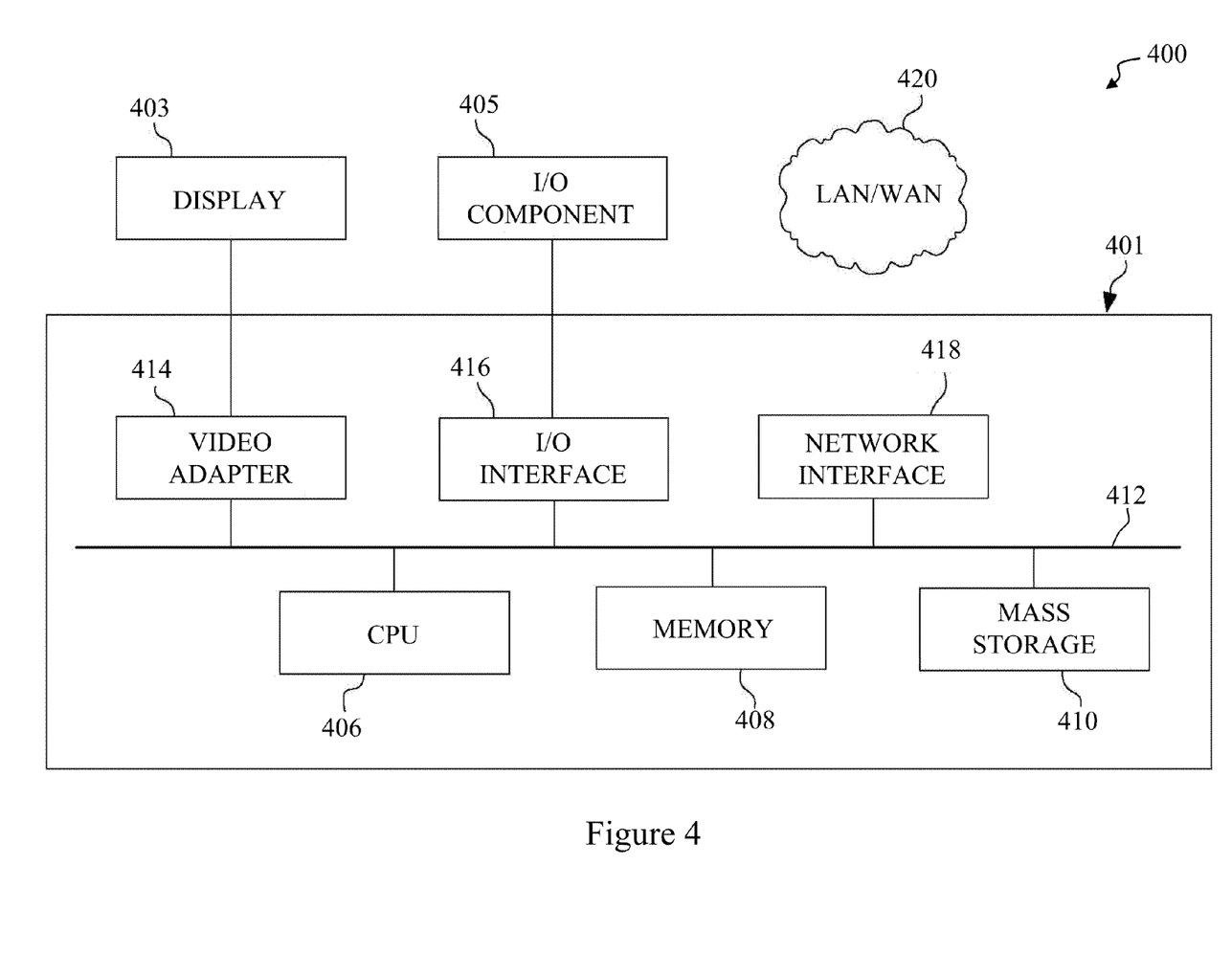
FIG. 4 illustrates a design calculator that may be used to determine the layout of the first package component in accordance with an embodiment.

FIG. 4 illustrates in greater detail an embodiment of the design calculator 400 that may be utilized to determine the layout of the package component 100. The design calculator 400 may be any form of computer processor that can be used in an industrial setting for analyzing data or may alternatively be a general purpose computer platform programmed for such analysis. In an embodiment the design calculator 400 may comprise a processing unit 401, such as a desktop computer, a workstation, a laptop computer, or a dedicated unit customized for a particular application. The design calculator 400 may be equipped with a display 403 and one or more input/output components 405, such as sensor inputs, a mouse, a keyboard, printer, combinations of these, or the like. The processing unit 401 may include a central processing unit (CPU) 406, memory 408, a mass storage device 410, a video adapter 414, and an I/O interface 416 connected to a bus 412.

The bus 412 may be one or more of any type of several bus architectures including a memory bus or memory controller, a peripheral bus, or video bus. The CPU 406 may comprise any type of electronic data processor, and the memory 408 may comprise any type of system memory, such as static random access memory (SRAM), dynamic random access memory (DRAM), or read-only memory (ROM). The mass storage device 410 may comprise any type of storage device configured to store data, programs, and other information and to make the data, programs, and other information accessible via the bus 412. The mass storage device 410 may comprise, for example, one or more of a hard disk drive, a magnetic disk drive, or an optical disk drive.

The video adapter 414 and the I/O interface 416 provide interfaces to couple external input and output devices to the processing unit 401. As illustrated in FIG. 4, examples of input and output devices include the display 403 coupled to the video adapter 414 and the I/O component 405, such as sensors, a mouse, keyboard, printer, and the like, coupled to the I/O interface 416. Other devices may be coupled to the processing unit 401 and additional or fewer interface cards may be utilized. For example, a serial interface card (not shown) may be used to provide a serial interface for a printer. The processing unit 401 also may include a network interface 418 that may be a wired link to a local area network (LAN) or a wide area network (WAN) 420 and/or a wireless link.

It should be noted that the design calculator 400 may include other components. For example, the design calculator 400 may include power supplies, cables, a motherboard, removable storage media, cases, and the like. These other components, although not shown in FIG. 4, are considered part of the design calculator 400.

Figure 5:
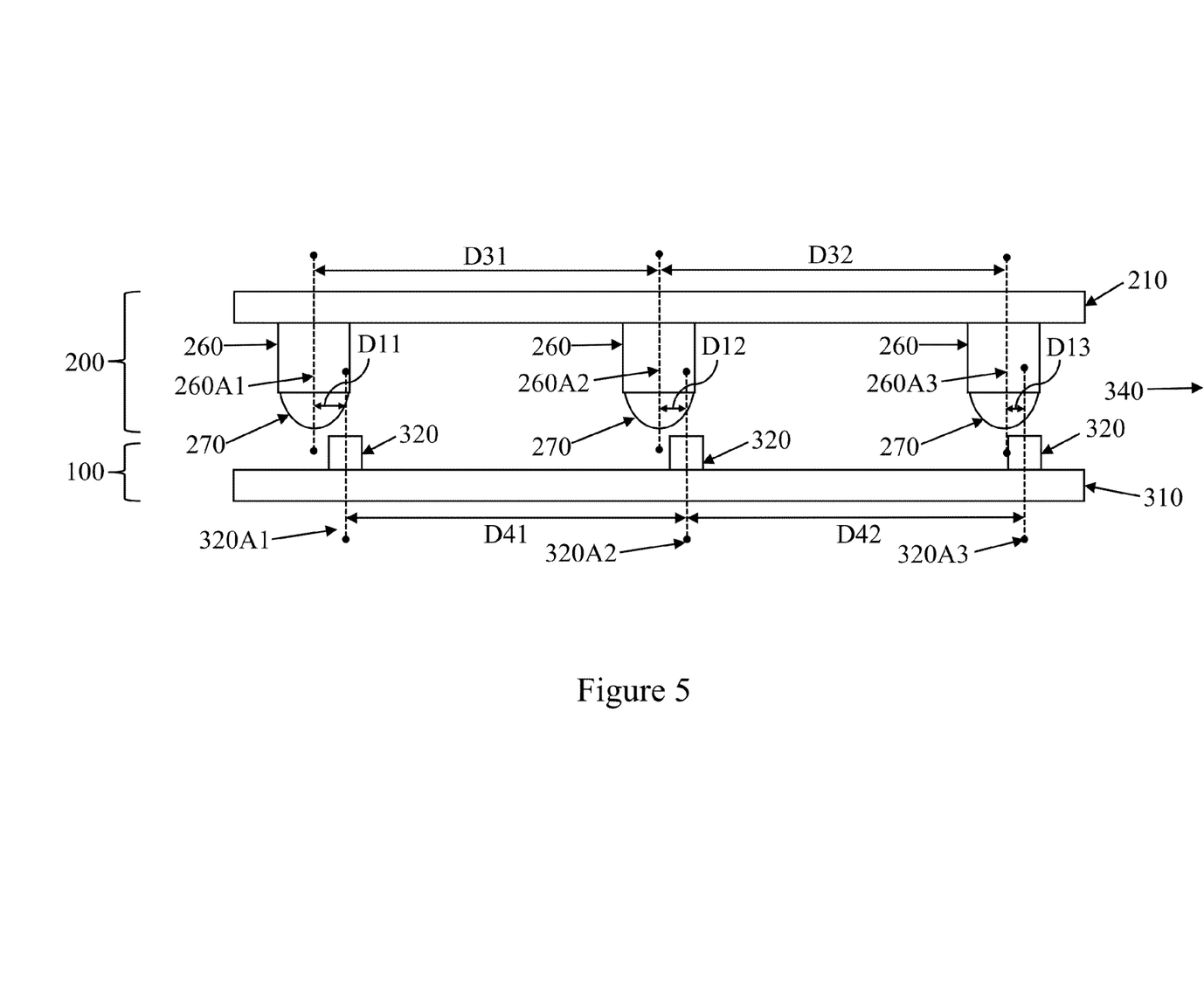
FIG. 5 illustrates in a cross-sectional view of another embodiment of a device structure.

FIG. 5 illustrates a cross-sectional view of another embodiment of package components 100 and 200 before the bonding process including three metal pillars 260, three solder bumps 270, and three landing traces 320. The metal pad and passivation layers of the package component 200 have been omitted for clarity. In FIG. 5, the arrow 340 (see FIG. 3a through 3c) is drawn to illustrate the direction of the center of the package component 100 as shown by dashed lines 150 (see FIG. 1). Illustrated in FIG. 5, the metal pillars 260 each have a center 260A (260A1 through 260A3 for each metal pillar 260) and the landing traces 320 each have a center 320A (320A1 through 320A3 for each landing trace 320). Each of the centers 260A and 320A have a corresponding distance D1 (D11 through D13) between the center 260A and the center 320A. The centers 260A1, 260A2, and 260A3 are each separated by distances D31 and D32, respectively. In addition, the centers 320A1, 320A2, and 320A3 are each separated by distances D41 and D42, respectively.

In an embodiment, the metal pillars 260 and landing traces 320 in FIG. 5 are within one of the vertical compensation regions 130 or one of the horizontal compensation regions 140 (see FIG. 1). As discussed above (see "Distance from Center" variable in formula for calculating D1), the further away the metal pillars 260 and landing traces 320 are from the center dashed lines 150X and 150Y, the greater the amount of shifting before the bonding process, distance D1, for the landing traces 320. Thus, in FIG. 5, the distance D41, the distance between the two landing traces 320 furthest from the center dashed lines 150X or 150Y, is less than the distance D42, the distance between the two landing traces 320 closest to the center dashed lines 150X or 150Y. While the respective distances D31, the distance between the two metal pillars 260 furthest from the center dashed lines 150X or 150Y, and D32, the distance between the two metal pillars 260 closest to the center dashed lines 150X or 150Y, are approximately equal. Accordingly, the distance D11 is greater than D12 and the distance D12 is greater than D13.

An embodiment is a method for designing a package. The method comprising using a computer processor, determining a coefficient of thermal expansion for two or more package components; storing the coefficient in a memory; determining processing parameters for the two or more package components, the processing parameters comprising a first temperature difference, the first temperature difference being between a solder solidification temperature and a room temperature of a first package component; and a second temperature difference, the second temperature difference being between the solder solidification temperature and the room temperature of a second package component. The method further comprising using the computer processor, analyzing design parameters for the two or more package components; and using the computer processor, modifying the design parameters based on the coefficient of thermal expansion and the processing parameters.

Another embodiment is a method for substrate layout. The method comprising using a computer processor, determining a difference of a coefficient of thermal expansion between a first package component and a second package component; determining processing parameters for the first package component and the second package component, the processing parameters comprising a first temperature difference, the first temperature difference being between a solder solidification temperature and a room temperature of the first package component; and a second temperature difference, the second temperature difference being between the solder solidification temperature and the room temperature of the second package component. The method further comprising using the computer processor, analyzing a first substrate trace layout for the first package component, the first substrate layout comprising a plurality of metal traces; and using the computer processor, calculating a second substrate trace layout for the first package component, the second substrate trace layout based on the first substrate layout, wherein the second substrate trace layout shifts one or more of the plurality of metal traces to compensate for the difference of the coefficient of thermal expansion between the first package component and the second package component.

A further embodiment is a device. The device comprising a first set of conductive contacts on a first substrate and the first set of conductive contacts having a first spacing. The device further comprising a second set of conductive contacts on a second substrate, the second set of conductive contacts configured to mate to the first set of conductive contacts on the first substrate, and the second set of contacts having a second spacing, the second spacing different from the first spacing.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for designing a package, the method comprising:
   using a computer processor, determining a coefficient of thermal expansion for two or more package components;
   storing the coefficient of thermal expansion in a memory;
   determining processing parameters for the two or more package components, the processing parameters comprising:
      a first temperature difference, the first temperature difference being between a solder solidification temperature and a room temperature of a first package component; and
      a second temperature difference, the second temperature difference being between the solder solidification temperature and the room temperature of a second package component;
   using the computer processor, analyzing design parameters for the two or more package components; and
   using the computer processor, modifying the design parameters based on the coefficient of thermal expansion and the processing parameters.

2. The method of claim 1, wherein the determining the coefficient of thermal expansion further comprises:
   determining a first coefficient of thermal expansion for the first package component;
   determining a second coefficient of thermal expansion for the second package component; and
   calculating a difference between the first coefficient of thermal expansion and the second coefficient of thermal expansion.

3. The method of claim 2, wherein the first package component is a package substrate and the second package component is a device die.

4. The method of claim 1, wherein the analyzing design parameters further comprises:
   locating a metal trace on the first package component; and
   determining a distance of the metal trace from a center of the first package component.

5. The method of claim 1, wherein the modifying the design parameters comprises shifting one or more metal traces on one of the two or more package components, wherein the shifting is based on a difference of the coefficient of thermal expansion between the two or more package components.

6. The method of claim 1, wherein the modifying the design parameters is only performed in a corner region of one of the two or more package components, the corner region adjacent a corner of the one of the two or more package components.

7. The method of claim 6, wherein the corner region further comprises a plurality of metal traces, the plurality of metal traces substantially perpendicular to an edge of the package component.

8. A method for substrate layout, the method comprising:
   using a computer processor, determining a difference of a coefficient of thermal expansion between a first package component and a second package component;
   determining processing parameters for the first package component and the second package component, the processing parameters comprising:
      a first temperature difference, the first temperature difference being between a solder solidification temperature and a room temperature of the first package component; and
      a second temperature difference, the second temperature difference being between the solder solidification temperature and the room temperature of the second package component;
   using the computer processor, analyzing a first substrate trace layout for the first package component, the first substrate layout comprising a plurality of metal traces; and
   using the computer processor, calculating a second substrate trace layout for the first package component, the second substrate trace layout based on the first substrate layout, wherein the second substrate trace layout shifts one or more of the plurality of metal traces to compensate for the difference of the coefficient of thermal expansion between the first package component and the second package component.

9. The method of claim 8, wherein the first package component is a package substrate and the second package component is a device die.

10. The method of claim 8, wherein the analyzing the first substrate layout is only performed in corner regions of the first package component, wherein the corner regions are adjacent to a corner of the first package component, and the corner regions comprise one or more of the plurality of metal traces.

11. The method of claim 10, wherein the one or more of the plurality of metal traces in the corner regions are substantially perpendicular to an edge of the package component.

12. The method of claim 8, wherein the shifting of the one or more of the plurality of metal traces is in a direction perpendicular to an edge and towards a center of the first package component.

13. The method of claim 8, wherein the analyzing the first substrate layout further comprises:
 locating one of the plurality of metal traces; and
 determining a distance from the metal trace to a center of the first package component.

14. A method of designing a package, the method comprising:
 using a computer processor, determining a difference of a coefficient of thermal expansion between a first package component and a second package component;
 using the computer processor, analyzing a first trace layout for the first package component, the first layout comprising a plurality of conductive traces; and
 using the computer processor, modifying the first trace layout based on the difference of the coefficient of thermal expansion between the first package component and the second package component to form a second trace layout for the first package component.

15. The method of claim 14 further comprising:
 determining processing parameters for the first package component and the second package component, the processing parameters comprising:
  a first temperature difference, the first temperature difference being between a solder solidification temperature and a room temperature of the first package component; and
  a second temperature difference, the second temperature difference being between the solder solidification temperature and the room temperature of the second package component; and
 using the computer processor, further modifying the first trace layout based on the processing parameters for the first package component and the second package component.

16. The method of claim 14, wherein the first package component is a package substrate and the second package component is a device die.

17. The method of claim 14, wherein the modifying the first trace layout further comprises:
 shifting of the one or more of the plurality of conductive traces is in a direction perpendicular to an edge and towards a center of the first package component.

18. The method of claim 14, wherein the analyzing the first trace layout is only performed in corner regions of the first package component, wherein the corner regions are adjacent to a corner of the first package component, and the corner regions comprise one or more of the plurality of conductive traces.

19. The method of claim 18, wherein the one or more of the plurality of conductive traces in the corner regions are substantially perpendicular to an edge of the package component.

20. The method of claim 14, wherein the second package component comprises a plurality of conductive bumps, the plurality of conductive traces being configured to mate to the plurality of conductive bumps.

* * * * *